(12) United States Patent
Philipp et al.

(10) Patent No.: US 8,533,654 B2
(45) Date of Patent: *Sep. 10, 2013

(54) SIGNAL PROCESSING (75) Inventors: Harald Philipp, Zug (CH); Esat Yilmaz, Whitely (GB)

(73) Assignee: Atmel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/290,807

(22) Filed: Nov. 7, 2011

(65) Prior Publication Data

US 2012/0112770 A1    May 10, 2012

Related U.S. Application Data (63) Continuation of application No. 12/254,859, filed on Oct. 21, 2008, now Pat. No. 8,056,044.

(51) Int. Cl.
*G06F 17/50* (2006.01)

(52) U.S. Cl.
USPC .......... 716/136; 716/108; 716/113; 716/115; 716/134

(58) Field of Classification Search
USPC .......... 716/108, 113, 115, 134, 136; 327/551
See application file for complete search history.

(56) References Cited

U.S. PATENT DOCUMENTS

| | | | |
|---|---|---|---|
| 5,394,344 A | 2/1995 | Lippmann | |
| 6,112,119 A | 8/2000 | Schuelke | |
| 6,633,803 B1 | 10/2003 | Shal | |
| 6,992,659 B2 | 1/2006 | Gettemy | |
| 7,030,860 B1 | 4/2006 | Hsu | |
| 7,181,572 B2 | 2/2007 | Walmsley | |
| 7,663,607 B2 | 2/2010 | Hotelling | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |

(Continued)

FOREIGN PATENT DOCUMENTS

| | | |
|---|---|---|
| WO | 2008/016986 A2 | 2/2008 |
| WO | 2010/048226 A1 | 4/2010 |
| WO | WO 2012/129247 | 9/2012 |

OTHER PUBLICATIONS

International Application Serial No. PCT/US2009/061379, International Search Report mailed Mar. 8, 2010, 3 pages, Mar. 8, 2010.

(Continued)

*Primary Examiner* — Sun Lin
(74) *Attorney, Agent, or Firm* — Baker Botts LLP (57) ABSTRACT

An iterative method may comprise obtaining a current input signal value for a current iteration, comparing the current input signal value with an output signal value determined in a previous iteration, updating a counter value determined in the previous iteration based on the comparison such that the updated counter value replaces the previously determined counter value, determining a slew value based on the counter value, and adding the slew value to the previously determined output signal value to generate a new current output signal value. Different slew values may be added to the previous output signal to obtain a new output signal. The counter value is updated to reflect recent trends in the input signals. For example, if the input signal is on an upward trend, the counter value may be relatively high because it is incremented each time an input signal exceeds a previously determined output signal.

20 Claims, 5 Drawing Sheets

(56) References Cited

U.S. PATENT DOCUMENTS

| | | |
|---|---|---|
| 2009/0315854 A1 | 12/2009 | Matsuo |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |

OTHER PUBLICATIONS

International Application Serial No. PCT/US2009/061379, Written Opinion mailed Mar. 8, 2010, 5 pages, Mar. 8, 2010.
O'Haver, T., "Microprocessor-Based, Linear Response Time Low-Pass Filter," *Analytica Chemistry*, 50(4), (1978), 676-679.
U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

| TC | SV |
|---|---|
| -16 | -12 |
| -15 | -11 |
| -14 | -10 |
| -13 | -9 |
| -12 | -8 |
| -11 | -7 |
| -10 | -6 |
| -9 | -5 |
| -8 | -4 |
| -7 | -3 |
| -6 | -2 |
| -5 | -1 |
| -4 | -1 |
| -3 | -1 |
| -2 | -1 |
| -1 | -1 |
| 1 | 1 |
| 2 | 1 |
| 3 | 1 |
| 4 | 1 |
| 5 | 1 |
| 6 | 2 |
| 7 | 3 |
| 8 | 4 |
| 9 | 5 |
| 10 | 6 |
| 11 | 7 |
| 12 | 8 |
| 13 | 9 |
| 14 | 10 |
| 15 | 11 |
| 16 | 12 |

$T^-_{THRESH}$ → -5

$T^+_{THRESH}$ → 5

−ve TREND

NO TREND

+ve TREND

SIGNAL PROCESSING

RELATED APPLICATIONS

This application is a continuation under 35 U.S.C. §120 of U.S. patent application Ser. No. 12/254,859 filed Oct. 21, 2008, entitled "Signal Processing," which was issued on Nov. 8, 2011 as U.S. Pat. No. 8,056,044.

BACKGROUND ART

The invention relates to signal processing, and in particular to methods and apparatus for filtering signals, for example, to reduce the effects of noise, such as Gaussian noise and transient noise (spikes), in signals.

Signal processing is commonly performed in almost every field of electronics. A common task of signal processing is to filter input signals, e.g. signals derived from a measurement circuit or from a signal reproduction device. By way of example only, the following description will focus on the application of signal processing techniques to input signals representing measurements of capacitive coupling derived from a capacitance measurement circuit in a capacitive sensor application. However, it will be appreciated that the principles described herein may equally be applied to the processing of signals in any field of signal processing, e.g., in the fields of audio and/or video processing, computing, telecommunication systems, and so on.

A capacitance measurement circuit in a capacitive sensor will generally provide a series of measured signals S(t) representing measurements of the capacitive coupling C(t) of a sensor electrode to either a system ground or another electrode (depending on the technology employed). A pointing object, e.g. a user's finger, in the vicinity of the sensor electrode will modify this capacitive coupling, and so cause a change in the measured signals S(t). Thus changes in the measured signals S(t) are indicative of the presence of a pointing object, and a controller of a device incorporating the capacitance measurement circuit may respond accordingly, e.g. to activate a function associated with sensor electrode. In other types of sensor the measured signals may represent an estimated position of an object along the sensor. However, the exact nature of the sensor technology, and of what the measured signals represent, is not significant for the purposes of this description.

Figure 1:
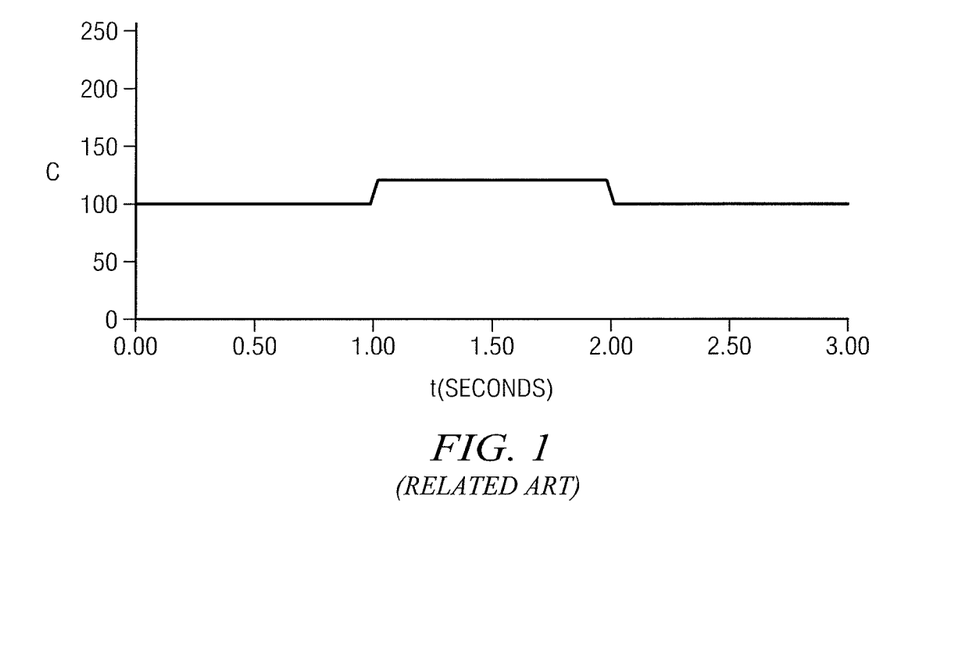
FIG. 1 shows a plot schematically representing a capacitive coupling of a sensor electrode in a capacitive sensor as a function of time.

FIG. 1 is a plot schematically representing the capacitive coupling C of a sensor electrode in a capacitive sensor as a function of time t as an object, e.g. a user's finger, is held within the sensitive area of the sensor for around 1 second and then removed. This may, for example, represent the situation where a user temporarily places their finger over the sensor electrode to activate some function of a device incorporating the capacitive sensor.

The capacitive coupling C is plotted in arbitrary units and is shown for period of three seconds. In this example the capacitive coupling C is taken to have a background value (when the user's finger is not adjacent the sensor electrode) of around 100 units. The approach of the user's finger at around t=1 s causes the capacitive coupling C to rise to around 120 units with a rise time of around 30 ms. The capacitive coupling remains around 120 units until the user removes their finger at around t=2 s. This causes the capacitive coupling to fall back to the background level of around 100 units, again on a timescale of around 30 ms. The output S from a measurement circuit configured to measure the capacitive coupling C would ideally track the curve shown in FIG. 1, e.g. so that a controller may identify the change in capacitive coupling and respond accordingly.

Figure 2:
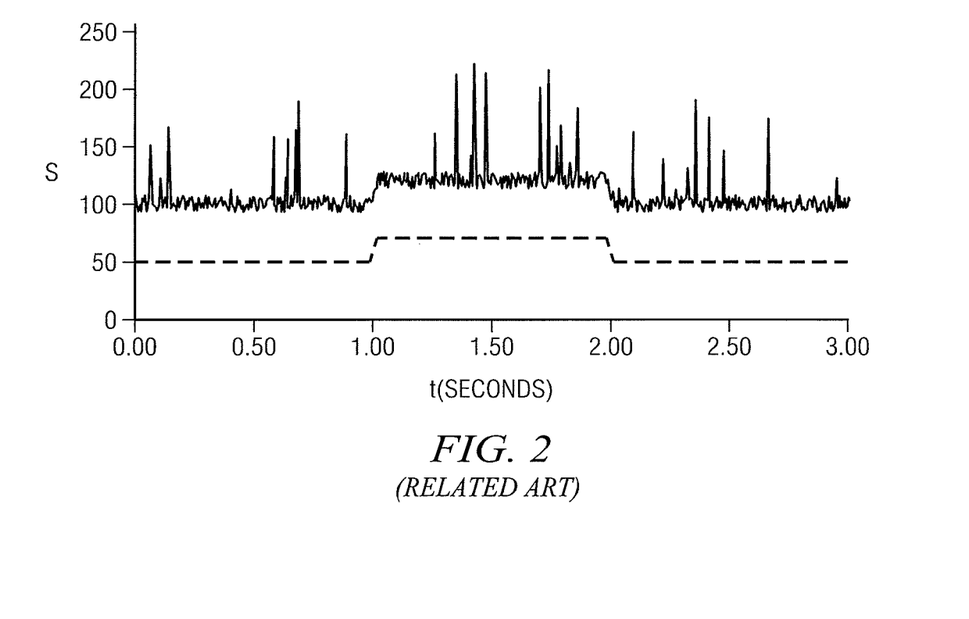
FIG. 2 shows a plot schematically representing a measured signal for the capacitive coupling variation shown in FIG. 1.

FIG. 2 is a plot schematically representing the signal S(t) that might typically be determined by a measurement circuit for the capacitive coupling variation plotted in FIG. 1. The capacitance measurement circuit in this example is assumed to be configured to provide an 8-bit digitised representation of the measured capacitance signal with a measurement made (i.e. a sample) every 5 ms. Also shown as a dotted line in FIG. 2 is the capacitive coupling C of FIG. 1 with a −50 units offset. This is included in FIG. 2 for ease of comparison.

As can be seen from FIG. 2, the measured signal S(t) does not exactly follow the true capacitive coupling C of FIG. 1 but includes a noise component. In this example the modelled noise is assumed to comprise a Gaussian component with a root mean square (RMS) variation of around 4 counts, and a series of randomly placed transient components (spikes) of varying heights (up to around 80 units). In this example the transient components are all positive going, but this is not of particular significance.

Thus FIG. 2 may be considered to represent a signal that might be measured in a typical implementation of a capacitive sensor. The signal is not intended to accurately reflect any particular sensor technology, usage conditions or noise characteristics, but is merely presented as an example signal to be used for the purposes of this description.

A common desire in the field of signal processing is to reduce the effects of signal noise such as that shown in FIG. 2, i.e. noise filtering. What is more, in many situations there is a desire to implement filtering schemes in simple hardware, i.e. without requiring complex processor components.

Figure 3:
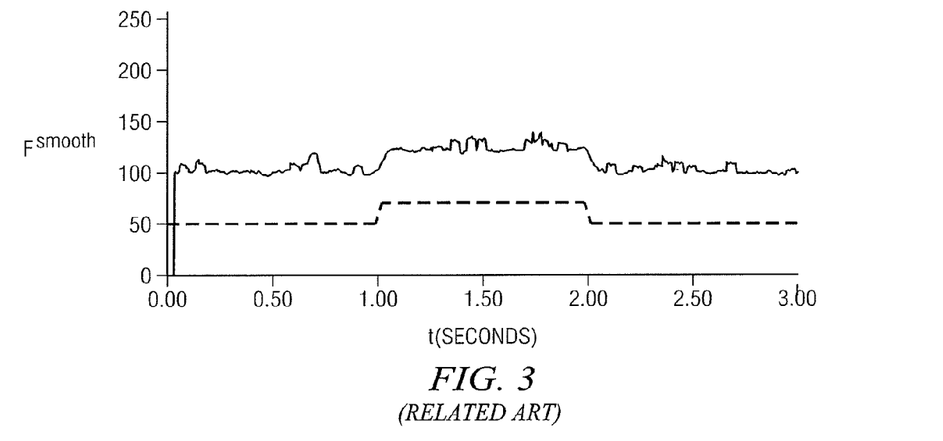
FIG. 3 shows a plot schematically representing a filtered signal obtained by applying a conventional smoothing filter to the signal plotted in FIG. 2.

FIG. 3 is a plot schematically representing a filtered signal $F^{smooth}(t)$ obtained by applying a conventional smoothing filter to the signal S plotted in FIG. 2. The capacitive coupling C of FIG. 1 is again shown by a dotted line (offset by −50 units). This is to allow comparison between the filtered signal $F^{smooth}$ and the capacitive coupling C the signal is intended to represent. The smoothing filter in this example is a simple moving-mean filter (box-car average filter). The moving-mean is determined by calculating the average of each sample of the measured signal S and the preceding eight samples. Thus the smoothing filter here is a nine-bin moving mean filter which may be applied in real time (i.e. it does not rely on future signal values).

The smoothing filter of FIG. 3 can be seen to be relatively effective at reducing Gaussian noise, but less effective at dealing with the transient noise events. The transient events are simply smeared out over a greater number of bins and are still readily apparent. Increasing the length of the moving-mean filter can improve the filtering characteristics, but at the cost of reduced temporal response. This is because changes in signal occurring on a timescale less than the size of the moving-mean window become blurred. A further drawback of the smoothing filter for many applications is that the averaging function requires a level of hardware complexity (e.g. a floating point processor) that is not desired. For example, in many cases there may be a desire, e.g. for cost saving reasons, to perform signal acquisition and processing using only a simple 8-bit microcontroller having no floating point processor. Thus not only does the smoothing filter of FIG. 3 perform relatively poorly, at least for a signal having the characteristics shown in FIG. 2, the filter function also requires relatively complex hardware. More advanced filtering algorithms, e.g. elliptic filters, may perform better than the simple smoothing filter example of FIG. 3, but these also require relatively complex hardware.

Figure 4:
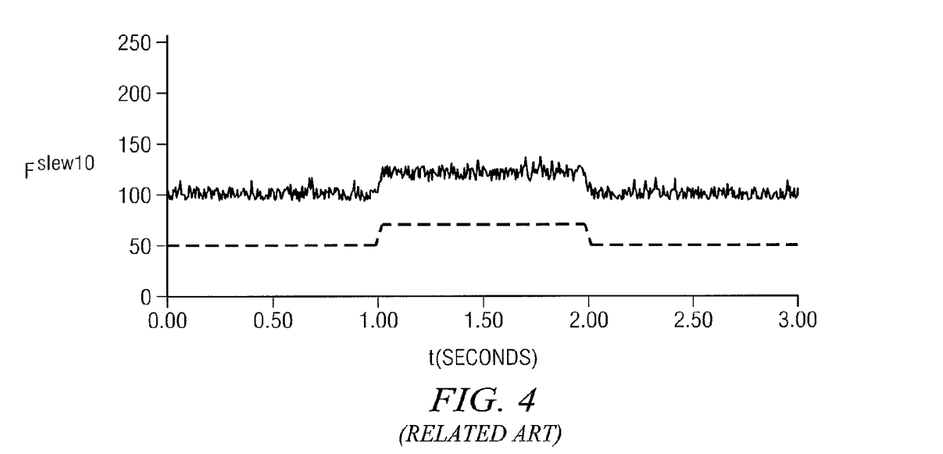
FIGS. 4 and 5 show plots schematically representing filtered signals obtained by applying conventional slew-rate limiting filters to the signal plotted in FIG. 2 for different slew-rate limits.

FIG. 4 is a plot schematically representing a filtered signal $F^{slew10}$ obtained by applying a conventional slew-rate limiting filter to the signal S plotted in FIG. 2. The capacitive coupling C of FIG. 1 is again shown for ease of comparison. A slew-rate limiting filter operates by restricting (capping) the maximum signal change that may occur between signal samples. Thus if a measured signal S is greater than a previously determined filtered signal by an amount greater than a pre-defined slew limit, the measured signal is replaced by the previously determined filtered signal plus the slew limit. Likewise, if a measured signal S is less than a previously determined filtered signal by an amount greater than a pre-defined slew limit, the measured signal is replaced by the previously determined filtered signal less the slew limit. The example slew filtered signal $F^{slew10}$ shown in FIG. 4 is generated by capping signal changes between samples of the signal shown in FIG. 2 at 10 units (i.e. the slew limit is 10 units).

The slew-rate limiting filter of FIG. 4 can be seen to be effective at reducing the transient noise events, but is less effective at dealing with the Gaussian noise. The RMS variation in the assumed Gaussian noise in this example is two to three times less than the slew limit. This means the restriction provided by the slew limit has no effect on the majority of the Gaussian noise variations between samples and so they remain in the signal. One way of increasing the effectiveness of the slew-rate limited filter in filtering the Gaussian noise is to reduce the slew-limit to less than the RMS variation in the Gaussian noise.

Figure 5:
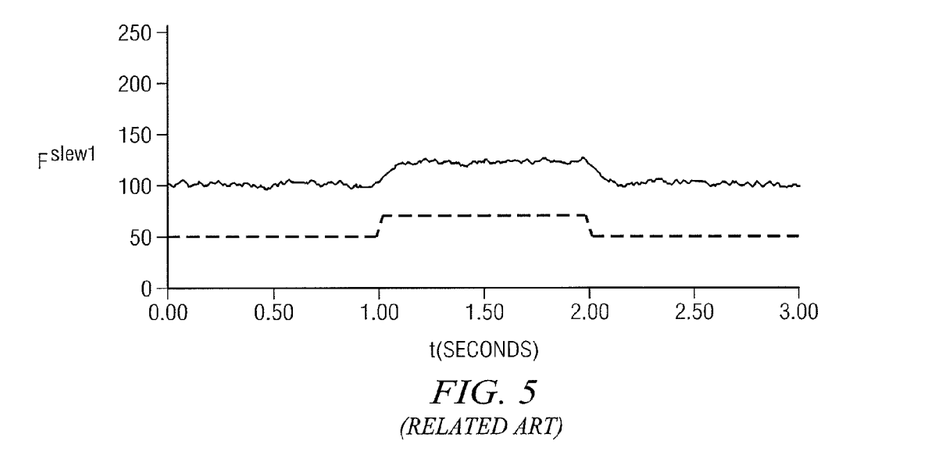

FIG. 5 is similar to and will be understood from FIG. 4, but shows a filtered signal $F^{slew1}$ obtained by applying a conventional slew-rate limiting filter to the signal S plotted in FIG. 2 with a slew limit of 1 unit (as opposed to 10 units as in FIG. 4). Thus changes between samples in the filtered signal $F^{slew1}$ are limited to +/−1 unit. This is less than the RMS value of the Gaussian noise, and so the filter is more effective at filtering this component of the signal S. Thus the slew-rate limiting filter of FIG. 5 is effective at reducing transient noise events and Gaussian noise. However, a drawback of the low slew limit is that the filter is not able to respond quickly to "real" changes in the signal. This is because the low slew limit prevents the filtered signal from changing quickly enough to track rapid changes in the signal S. For example the rise time of the "true" capacitive coupling C at around t=1 s is on the order of 30 ms, whereas the rise time of the slew-rate limited filtered signal $F^{slew1}$ here is around 150 ms. This slow response characteristic can be detrimental, or even unacceptable, in may situations.

There is therefore a need for filtering schemes which may be implemented in relatively simple hardware, but which do not suffer from the above-noted drawbacks of conventional filtering schemes.

SUMMARY OF THE INVENTION

According to a first aspect of the invention there is provided an iterative method for generating a series of output signal values from a series of input signal values, wherein iterations of the method comprise the steps of: (a) obtaining a current input signal value for the current iteration; (b) comparing the current input signal value with an output signal value determined in a previous iteration; (c) updating a counter value determined in the previous iteration based on the result of the comparison between the current input signal value and the previous output signal value; (d) determining a slew value based on the counter value; and (e) adding the slew value to the previously determined output signal value to generate a current output signal value.

Thus embodiments of the invention allow different magnitudes of slew values to be added to a previous output signal to obtain a new output signal depending on the value of a counter. The on-going counter is updated in each iteration, e.g. incremented or decremented depending on whether a current input signal value is greater or less than, a previous output signal. The running total of the counter may therefore indicate an extent to which there is an increasing or decreasing trend in the input signal values. Based on this, progressively higher slew values may be determined for increasing counter values to more quickly track the changing input signal. For values of the counter considered to indicate there is no particular trend in the input signals (i.e. for values around a base value such as 0), smaller slew values may be used so as to better suppress Gaussian noise variations. That is to say, the determination in step (d) may be based on the size of a difference between the counter value and a pre-defined base value, i.e. how far the counter value is from its base value, and, furthermore, the determination may be made such that slew values of greater magnitude are determined for counter values further from the base value than for counter values nearer to the base value.

The relationship between counter values and magnitudes of the slew values used in step (d) for determining the slew value may be a non-linear relationship. Thus slew values may increase more rapidly with increasing counter values, e.g. as an input signal trend becomes more established.

The slew value may, for example, by determined from the counter value in step (d) by reference to a pre-defined look-up table. For example a look-up table having a length of thirty two entries, e.g. between 5 and 50 entries. The slew value entries in the look-up table may be defined having regard to expected characteristics of the signal to be processed.

The method may further comprise defining a threshold counter value. The threshold counter value may be used to define distinct states of trend for an input signal. The nature of the processing may be different in different iterations depending on the state of trend. (Different threshold counter values may be defines for up-going and down-going trends.)

Thus the step of updating the counter value in step (c) may be performed differently depending on whether or not the counter value is beyond the threshold counter value.

The step of updating the counter value in step (c) may comprise comparing the counter value with the pre-defined threshold counter value, and either incrementing, decrementing, or resetting the counter value to a base value, depending on both the result of the comparison of the counter value with the pre-defined threshold counter value, and the result of the comparison of the current input signal value with the output signal value determined in the previous iteration.

This can help in keeping track of the extent to which the input signal is following a consistent trend, while also reducing the likelihood of random noise carrying the counter beyond the pre-defined threshold counter value to wrongly indicate the signal is in an established trend.

The method may further comprise determining whether both the counter value is beyond the threshold value and the step of updating the counter value in step (c) brought the counter value closer to the threshold value, and if so, setting the current output signal to the previous output signal. This can help to ensure the output signal does not overshoot when there is a reversal in trend of the input signal.

The method may further comprise determining whether the current input signal is within a range bound by the previous output signal and the current output signal, and if so, setting the current output signal to the current input signal. This can also help in reducing overshoot.

The counter value may be constrained to values between a pre-defined maximum counter value and a pre-defined minimum counter value, e.g. spanning 32 potential counter values.

The method may further comprise a step of initialising the counter value and defining a notional previous output signal to be used for the first iteration. The notional previous output signal for the first iteration may be a one of the input signal values.

The slew values may be defined to a higher precision than the input signal values. This can allow finer control of the output signal, for example where the signal noise levels are on the order of the resolution of the input signal.

In embodiments of the invention the current output signal may, at least in some iterations, be independent of the magnitude of the difference between the current input signal and the previous output signal, with only the direction of change being considered significant.

The input signal values may represent measurements from a sensing element of a capacitive sensor.

Iterations of the method may further comprise providing the output signal on an output signal line.

According to a second aspect of the invention there is provided an apparatus, e.g. a suitably configured microcontroller, for generating a series of output signal values from a series of input signal values, the apparatus comprising a processing component and a storage component comprising registers for storing a counter value and a previous output signal value, and wherein the processing component is operable to iteratively perform the steps of (a) obtaining a current input signal value for the current iteration; (b) comparing the current input signal value with a previous output signal value retrieved from the storage component; (c) updating a counter value stored in the storage component based on the result of the comparison between the current input signal value and the previous output signal value; (d) determining a slew value based on the counter value; and (e) adding the slew value to the previously determined output signal value to generate a current output signal value.

BRIEF DESCRIPTION OF THE DRAWINGS

For a better understanding of the invention and to show how the same may be carried into effect reference is now made by way of example to the accompanying drawings in which.

DETAILED DESCRIPTION

Figure 6:
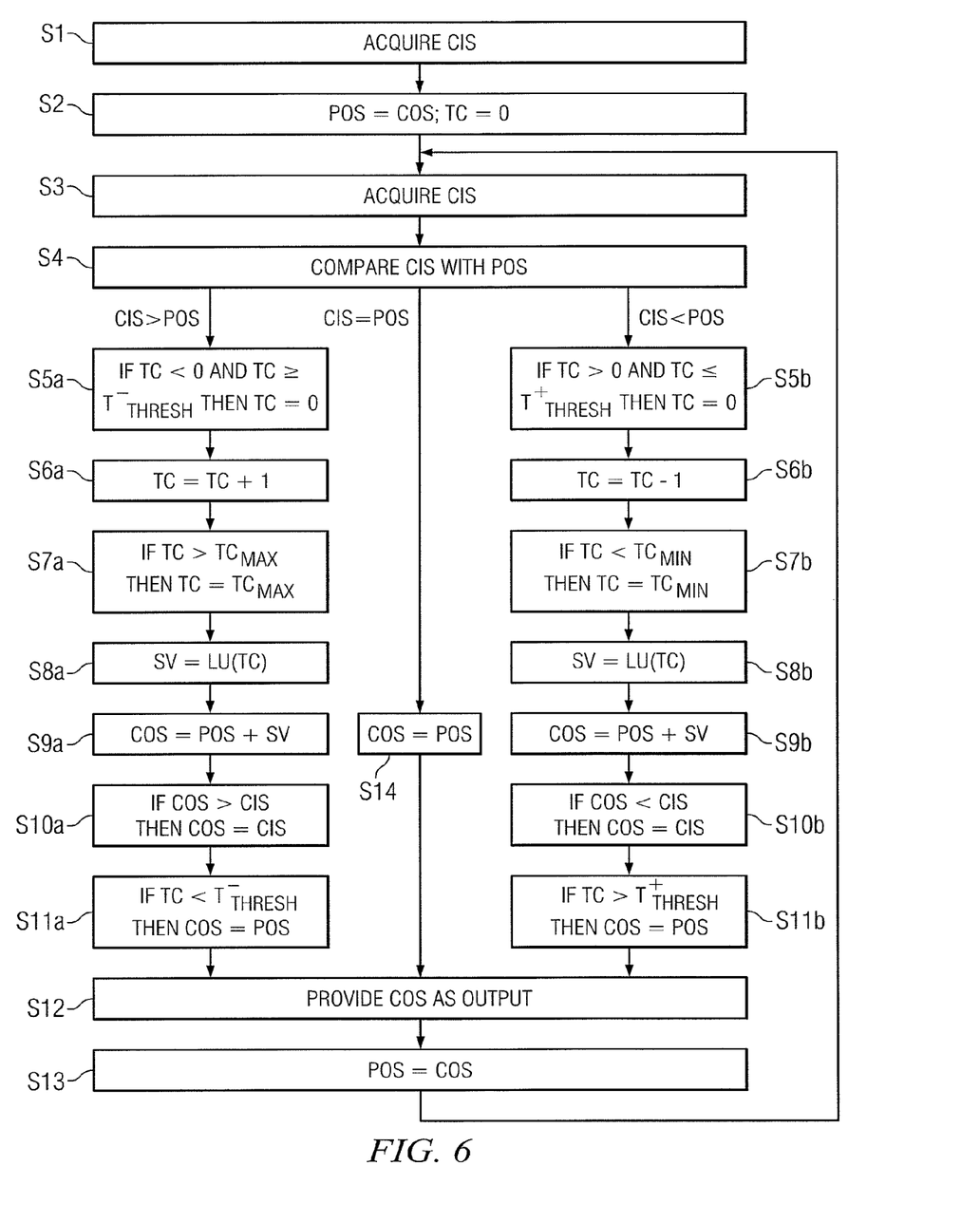
FIG. 6 schematically shows a flow diagram representing signal processing in accordance with an embodiment of the invention.

FIG. 6 schematically shows a flow diagram representing processing of a signal, for example a signal such as shown in FIG. 2, in accordance with an embodiment of the invention. In some respects the processing may be viewed as a variation of the conventional slew rate limiting filter scheme, and in this regard may sometimes be referred to as a progressive slew rate filter scheme, or a variable slew-rate filter scheme.

The processing method represented in FIG. 6 is an iterative method, the method may be applied in real-time to an input signal comprising a series of input signal values (samples) to generate a filtered output signal comprising a corresponding series of output signal values.

In broad summary, the processing represented in FIG. 6 is based on iteratively selecting a slew value to add to a previously determined output signal value to provide an output signal value for the current iteration. The slew value (at least in some iterations) is determined in dependence on the value of a counter, referred to here as a trend counter. The trend counter is incremented or decremented in each iteration depending on whether the current input signal is greater than or less than the previously determined output signal value. The trend counter in this embodiment is defined such that a relatively large valued positive trend counter is indicative of a recent series of signal values being higher than their respective previously determined output signal values (thus suggesting a consistent upward trend in the input signal). Similarly, a relatively large valued negative trend counter is indicative of a recent series of input signal values being lower than their respective previously determined output values (suggesting a steady downward trend in the input signal). The slew values for each trend counter value in this embodiment are determined by reference to a pre-defined look-up table.

Figure 7:
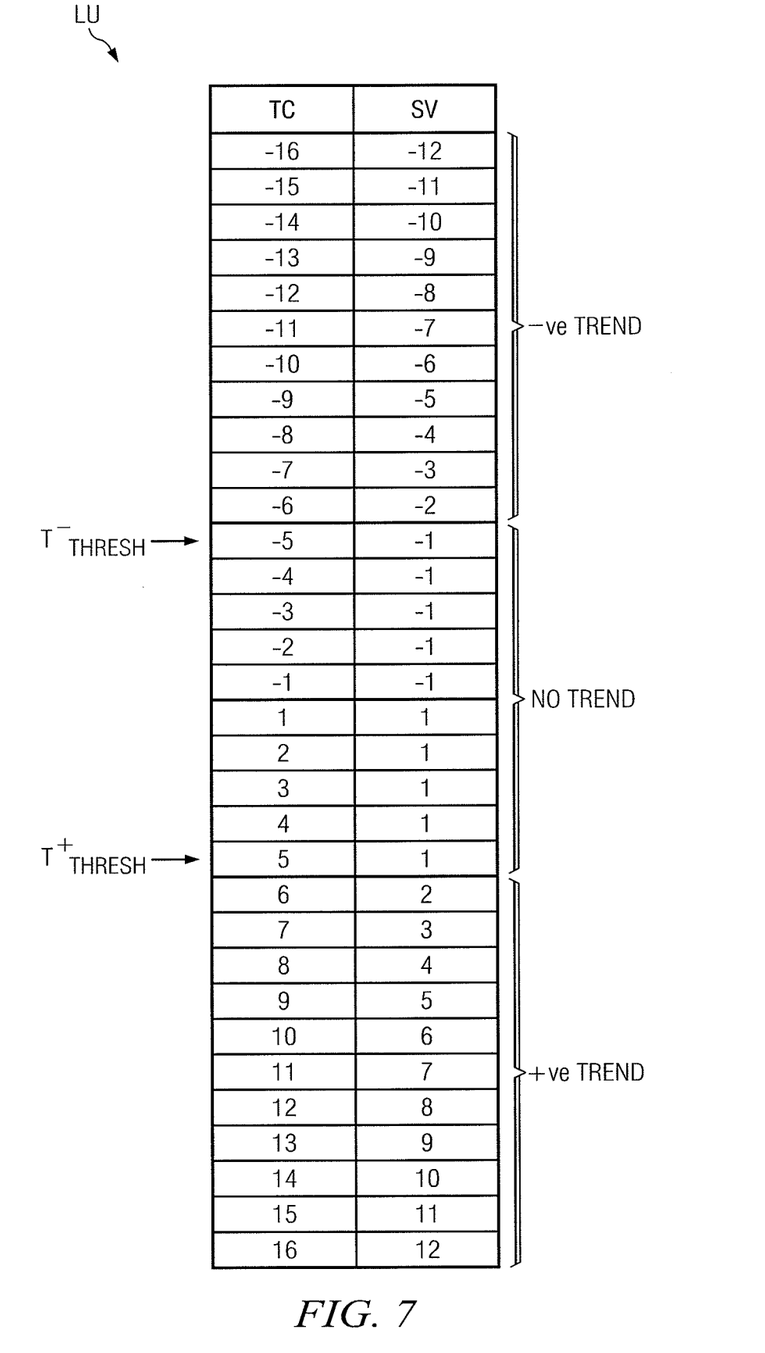
FIG. 7 schematically shows a look-up table for obtaining a slew value from a trend counter in accordance with an embodiment of the invention.

FIG. 7 schematically shows an example look-up table (LU) that may be used in accordance with embodiments of the invention. The look-up table defines values of slew value (SV) for different trend counter values (TC) ranging from a minimum trend counter value $T_{MIN}$ to a maximum trend counter value $T_{MAX}$. In this example the minimum and maximum trend counters have the same magnitude ($TC_{MIN}=-16$ and $TC_{MAX}=+16$), but in other embodiments these parameters may not have the same magnitude. In this example the look-up table has a degree of mirror symmetry between positive and negative trend counter values (i.e. $SV(-TC)=-SV(TC)$), but this need not necessarily be the case.

The look-up table LU in FIG. 7 is schematically represented as comprising three sections. One section (uppermost in FIG. 7) may be referred to as negative-trend section. The negative-trend section corresponds to trend counter values less than a negative trend counter threshold ($TC^-_{THRESH}$). Another section (lowermost in FIG. 7) may be referred to as positive-trend section. The positive-trend section corresponds to trend counter values greater than a positive trend counter threshold ($TC^+_{THRESH}$). The remaining middle section of look-up table may be referred to as a non-trend section. The non-trend section corresponds to trend counter values including and between the negative trend counter threshold ($TC^-_{THRESH}$) and the positive trend counter threshold ($TC^+_{THRESH}$). In this example the negative and positive trend counter thresholds have the same magnitude ($TC^-_{THRESH}=-5$ and $TC^+_{THRESH}$=+5), but in other embodiments these parameters may not have the same magnitude.

At times when the trend counter value is greater than the positive trend counter threshold ($TC^+_{THRESH}$), the input signal may be referred to as being in positive trend. Similarly, when the trend counter value is less than the negative trend counter threshold ($TC^-_{THRESH}$), the input signal may be referred to as being in negative trend. When the trend counter is in the non-trend section of the look-up table, the input signal may be referred to as being out of trend (not in trend).

It may be noted that the general structure of the look-up table in this embodiment is such that the magnitudes of the slew values are relatively small when the input signal is out of trend, but become progressively larger as the trend counter moves further into the in-trend sections of the look-up table. The significance of the different sections of the table (i.e. the significance of the thresholds) for processing represented in FIG. 6 is described in more detail further below.

Referring back now to the flow diagram of FIG. 6, the processing in this example is assumed to be implemented in a suitably programmed microcontroller, the microcontroller is arranged to receive an input signal comprising a series of digital input signal values (the values may equally be generated internally depending on the specific implementation at hand), and to generate a corresponding filtered series of digitised output signal values.

Steps S1 and S2 represent initialisation steps. As noted above, the processing of FIG. 6 is an iterative-based method with individual output signal values being generated in individual iterations. Furthermore, and as described in more detail below, each output signal value is determined having regard to the previous output signal value (POS) and the on-going trend counter (TC). Thus in Steps S1 and S2 the previous output signal and trend counter parameters are assigned initial values. An initial current input signal (CIS) is acquired in Step S1. In Step S2 the notional previous output signal to be used in the first iteration of the method is initialised to the current input signal value acquires in Step S1. In Step S2 the trend counter is also initialised, in this example to 0. Embodiments of the invention are relatively robust to the initialised values for the previous output signal and trend counter and the processing will generally settle to appropriate output signal values after only a few iterations regardless of the initial values chosen for these parameters. For example in some embodiments, Step S1 may be avoided, and the previous output signal might simply set to 0, or a mid-point of the signal range. The trend counter and previous output signal may be stored in corresponding trend counter and previous output signal registers of the microcontroller.

The iterative part of the processing of FIG. 6 starts at Step S3. In Step S3 a current input signal (CIS) for the current processing iteration is acquired (e.g. from an external measurement circuit/signal source, or from another functional aspect of the microcontroller implementing the processing of FIG. 7).

In Step S4 the current input signal is compared with the previous output signal stored in the previous output signal register to determine whether or not the current input signal is greater than, less than, or equal to the current input signal.

If the current input signal is greater than the previous output signal, processing follows from Step S4 to Step S5a. If the current input signal is less than the previous output signal, processing follows from Step S4 to Step S5b. Steps S5a and S5b head two parallel branches of the processing flow down through to Steps S11a and S11b respectively. The branch from Step S5a to S11a is followed where the current input signal is greater than the previous output signal. This may thus be referred to as the increasing-signal branch of the processing. The branch from Step S5b to S11b is followed where the current input signal is less than the previous output signal. This may thus be referred to as the decreasing-signal branch of the processing. For the iteration described in this example it will be assumed the current input signal is greater than the previous output signal such that the processing passes from Step S4 to Step S5a.

In Step S5a the trend counter from the previous iteration is retrieved from the trend counter register, and a check is made to determine whether the trend counter is both negative and greater than or equal to the negative trend counter threshold value $TC^-_{THRESH}$. If this dual requirement is satisfied, the trend counter is set to a reset value corresponding to the "middle" of the look-up table, i.e. in this example the trend counter is set to 0. The effect of resetting the trend counter in these conditions (in conjunction with Step S6b of the decreasing-signal branch) is that the trend counter will only escape the non-trend section of the look-up table and enter the negative trend section if there is a continuous sequence of at least $1+T^-_{THRESH}$ (i.e. in this example 6) iterations in which the current input signal is less than the previous output signal. That is to say, to get into negative trend, the processing needs to follow the decreasing-signal branch at least six times in succession since a single pass down the increasing-signal branch when not in trend will reset the trend counter. The corresponding Step S5b in the decreasing-signal branch similarly ensures (in conjunction with Step S5a) that the trend counter will only escape the non-trend section of the look-up table and enter the positive trend section if there is a continuous sequence of at least $1+T^-_{THRESH}$ (again 6 in this example) iterations in which the current input signal is greater than the previous output signal.

In Step S6a the trend counter is incremented by 1. Thus if the processing entered the increasing-signal branch from Step S4 when already in positive trend, the trend counter in incremented still further above the positive trend counter threshold $T^+_{THRESH}$ (i.e. the positive trend is considered strengthened). If the processing entered the increasing-signal branch from Step S4 with a positive trend counter, but without being in trend (i.e. trend counter<$TC^+_{THRESH}$), the trend counter in incremented towards the positive trend counter threshold $T^+_{THRESH}$ (i.e. the signal moves closer to being considered in trend). If the processing entered the increasing-signal branch from Step S4 when in negative trend (i.e. trend counter< $TC^-_{THRESH}$), the trend counter in incremented towards the negative trend counter threshold $T^-_{THRESH}$ (i.e. the negative trend is considered weakened).

In Step S7a, a check is performed to determine whether the trend counter has been incremented beyond its pre-defined maximum value ($TC_{MAX}$). If so, the trend counter is set to $TC_{MAX}$. This ensures the trend counter remains capped at a value matching one in the look-up table.

In Step S8a, a slew value (SV) for the current iteration is determined based on the trend counter by reference to the look-up table shown in FIG. 7. For example, if the trend counter were 8, a slew value of 4 units would be determined. If the trend counter were −13, a slew value of −9 would be determined, and so on.

In Step S9a the slew value determined in Step S8a is added to the currently stored previous output signal. The result of this addition is defined to be a current output signal for the present iteration.

If there is a consistent upward trend in the input signal, the current input signal value in each iteration is more likely to be higher than the previous output signal values. This means the processing will tend to follow the increasing signal-branch of the flow diagram shown in FIG. 6 more often, which in turn will mean the trend counter will steadily increase (via Step S6a) towards its defined maximum value. Furthermore, it may be noted from the look-up table of FIG. 7 that higher trend counter values are associated with higher slew values. This means if the input signal is displaying a generally upward trend, the slew values determined in subsequent iteration become higher and higher. This allows the output signals determined in Step S9a in a series of subsequent iterations to more quickly track the increasing input signal since larger steps in the output signal can be made when in trend.

In some embodiments the current output signal determined in Step S9a may be output by the microcontroller (or passed to another internal function of the microcontroller) as a final result of the filtering process for the current input signal. However, in this embodiment, two additional steps are performed which may result in the current output signal determined in Step S9 being modified before being output as a result of the filtering. The inventors have found that these additional steps/constraints can in some circumstances provide for improved filtering performance.

Thus in Step S10a a check is made to determine whether the addition of the slew value in step s9a has taken the current output signal over the current input signal (i.e. a check is made to see whether the determined current output signal for the current iteration has overshot the current input signal value). If the current output signal has overshot the current input signal, the current output signal determined in Step S9a is replaced with the current input signal. Step S10a thus acts to prevent the current output signal from going higher than the current input signal when the input signal is increasing. This ensures for an up-going input signal the current output signal cannot exceed the current input signal.

In Step S11a check is made to determine whether the input signal is currently in negative trend (i.e. if the trend counter is less than the negative trend threshold value). If it is, this indicates there has been a recent downward trend in the input signal, and so the current input signal represents a reversal of this trend. In this case the current output signal determined in Step S9a is replaced with the previous output signal. That is to say, the output signal is prevented from changing. This step ensures a slew value associated with a negative trend counter (e.g. a negative slew value) is not applied to the previous output signal when the current input signal is higher than the previous output signal (i.e. when the increasing-signal branch is followed while in negative trend). This can assist in preventing overshoot of the output signal when there is a trend reversal in the input signal.

In Step S12 the current output signal is output by the microcontroller (or passed to another internal function of the microcontroller) as a final result of the filtering process for the current input signal.

In Step S13 the previous output signal value is replaced with the current output signal value in preparation for the next iteration. Processing then returns to Step S3 where a "new" current output signal is acquired for the next iteration of the method. The new current output signal may be acquired from a store as soon as the processing returns to Step S3 (in the event the processing is used to filter a stored signal), or the processing may be delayed until a new current output signal is provided by an attached measurement circuit (e.g. in the event the processing is used to filter a "real-time" signal such as an output from a capacitive coupling measurement circuit).

The above description of the flow diagram shown in FIG. 6 has focussed on the increasing-signal branch by way of example only. The steps of the decreasing-signal branch operate in an inverse (mirror) manner to the steps of the increasing-signal branch. The steps are otherwise similar to and will be understood from the corresponding steps of the increasing-signal branch. For example in Step S6b of the decreasing-signal branch, the trend counter is decremented by one, rather than incremented as it is in Step S6a of the increasing signal branch. By way of another example, Step S10b acts to prevent the current output signal from going below the current input signal when the input signal is decreasing. This is the mirror of Step S10a which, as described above, acts to prevent the current output signal from going higher than the current input signal when the input signal is increasing. The other steps of the decreasing-signal branch will be readily understood from FIG. 7 in conjunction with the above description of the correspondingly mirrored steps of the increasing-signal branch. These steps are not described further here in the interest of brevity.

Nonetheless, for completeness, it is noted that in the trivial case of the current input signal being found to be equal to the previous output signal in Step S3, the processing passes from Step S3 to Step S14. In step S14 the current output signal is set to the previous output signal, and processing passes directly to Step S12 and continues as described above. It may be noted that Step S14 is only employed here to ensure a current output signal is defined in the event the current input signal is found to be equal to the previous output signal in the very first iteration. If this were not a concern, e.g. because the initialised value for previous output signal set in Step S2 were purposely set to an unrealistic value, then Step S14 could be avoided.

Figure 8:
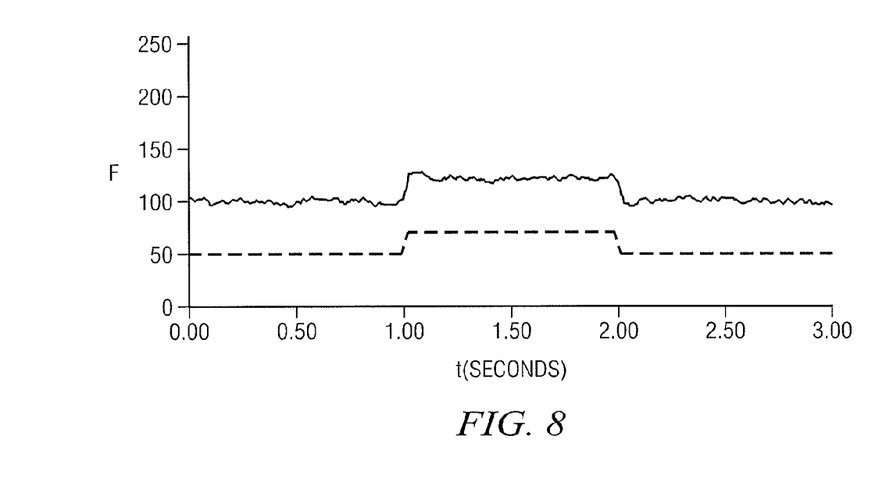
FIG. 8 shows a plot schematically representing a filtered signal obtained by processing the signal plotted in FIG. 2 in accordance with an embodiment of the invention.

FIG. 8 is a plot schematically representing a filtered signal F(t) obtained by processing the signal S(t) plotted in FIG. 2 in accordance with the flow diagram shown in FIG. 6 in accordance with an embodiment of the invention. The "true" capacitive coupling C of FIG. 1, which is the basis for the "noisy" signal S of FIG. 2, is also shown by a dotted line (offset by −50 units). This is again included to allow easy comparison between the filtered signal F and the capacitive coupling C the filtered signal is intended to represent.

It is apparent from FIG. 8 that the signal processing in accordance with embodiments of the invention performs better than any of the filtering schemes represented in FIGS. 3 to 5. Furthermore, the processing of FIG. 6 requires only simple hardware complexity. It will be appreciated that it may be possible to define complex filtering functions which perhaps perform better than seen in FIG. 8, but these more complex filter functions would require correspondingly more complex processing capabilities, and could not, for example, be implemented in a simple 8-bit microcontroller without a floating point processor. Processing in accordance with embodiments of the invention not only avoids the need for complex processing hardware, but the memory requirements are also low. For example, there is no need to store significant numbers of data values. The only variable parameters that need to be stored between iterations are the trend counter and the previous output signal. All the other parameters are either fixed (e.g. the look-up table entries), or do not require storing between iteration (e.g. current input signal values).

In broad summary, the processing of FIG. 6 may be seen as a modified slew rate limiting filter. Some significant aspects of processing in accordance with this embodiment of the invention are as follows.

The current output signal for an iteration is independent of the magnitude of the difference between the current input signal and the previous output signal (apart from in the special circumstances of Steps S10a and S10b). All that matters so far as the value of the current input signal is concerned is whether it is greater or less than the previous output signal. The slew value to be added is then determined simply from the value of the on-going trend counter.

The magnitude of the slew value to be added is not a fixed cap, but is selected from a range of values. I.e. there are multiple possible slew value magnitudes which may be added/subtracted from the previous output signal. Processing in accordance with embodiments of the invention may thus be seen in some respects as an adaptive slew rate limiting filter. When there is no clear upward or downward trend in the input signal, the trend counter remains close to zero, and so the slew values are relatively small (see FIG. 7). This provides for good filtering of the Gaussian noise (similar to as seen in FIG. 5). However, where there is a clear upward or downward trend in the input signal, the trend counter moves away from zero, and so the slew values become relatively high (again see FIG. 7). This allows the output signal to respond more quickly to changes in input signal (similar to as seen in FIG. 4) than would be the case if the slew values were limited to a single low value (as in FIG. 5). Thus the use of different magnitudes of slew value depending on a parameter indicative of the extent to which the input signal is following a trend provides a single filter scheme having the advantages of the filter represented in FIG. 4 (fast response) and the advantages of the filter represented in FIG. 5 (good Gaussian noise rejection), and without the respective drawbacks of these filters.

An appropriate structure for a look-up table for a given application may be may be determined experimentally. The following considerations may also be considered. The length of the look-up table (i.e. the values of $TC_{MAX}$ and $TC_{MIN}$) for the embodiment shown in FIG. 7 are likely to be suitable for most applications. Similarly, the thresholds between the in-trend and out-of-trend regions of the look-up table shown in FIG. 7 are also likely to be suitable for most applications, particularly for Gaussian noise distributions. Slew values in the out-of-trend (non-trend) section of look-up table may be selected having regard to the expected RMS noise level for the application at hand. For example, out-of-trend slew values on the order of 25% of the expected RMS noise level may be appropriate. The magnitude of the slew values in the in-trend section of look-up table may be selected having regard to the maximum change in input signal for the application at hand. For example, out-of-trend slew values increasing to around 50% of the expected maximum input signal change may be appropriate to ensure rapid tracking. The rate at which the slew values increase with trend counter may depend on the expected rapidity of changes in the input signal. If it is expected that an input signal will typically change significantly over only a few signal samples, it may be appropriate for the slew values to increase more aggressively with increasing trend counter than would be the case if the input signal were expected to rise more steadily.

It may also be noted that the look-up table in FIG. 7 has a high degree of (minor) symmetry. Thus the filter responds to positive-going changes in the input signal in the same way as it responds to negative-going changes. However, in other embodiments, the positive and negative halves of the table may be different. For example, if in a given application it is expected that an input signal will typically increase steadily over characteristic rise time, but decrease more quickly over a much shorter characteristic fall time, an asymmetric look-up table may be used. For example, slew values for negative trend counters may be greater than the slew values for the corresponding positive trend counters to ensure faster tracking. Similarly the negative trend counter threshold may have a smaller magnitude than the positive trend counter threshold so that the processing is likely to enter a state of negative trend more rapidly.

In case the look-up table does have a high degree of symmetry, there is of course no need to define and store both halves of the table. A relationship between the magnitude of the trend counter and the corresponding magnitude of slew values may be used, with the sign of the trend counter used to indicate whether or not the slew value should be added or subtracted etc.

It will be appreciated that the specific processing flows described above may be subject to many modification, and the overall functionality described above may be implemented in different ways. For example various steps of the method represented in FIG. 6 may be performed in a different order, e.g. Steps S12 and S13 could readily be swapped.

It will also be appreciated that the slew values may, especially those in the out of trend section of the look-up table be specified to a precision greater than the resolution of the input signal. For example, decimal slew values may be used. In the context of a practical implementation of this feature in a digital microcontroller, the effect of having decimal values may be achieved by defining a word length for the current input value, current output value and previous output value maintained by the microcontroller which is longer than the true word length of the input signals acquired in step S3. For example, current input value, current output value and previous output value may be maintained in the microcontroller as 10-bit words while the input values acquired in Step S3 are only 8-bit words. The eight most-significant bits of the 10-bit current input value maintained by the microcontroller may be populated with the 8-bits of the current input value acquired in Step S3. This effectively multiplies the current input signal by a factor of 4. The slew values of FIG. 7 are thus in effect reduced in their relative significance by a factor of 4 (assuming they maintain the same absolute values). Thus the slew value magnitudes of 1 in the not-in-trend section of the table in effect become slew values magnitudes of 0.25. This is because it will now take the addition or subtraction of four of them to effect the least significant bit of the acquired 8-bit current input signal. The 10-bit output signals may be truncated to 8-bits for outputting in Step S12, or may be output as 10-bit numbers.

The use of decimal values in this way allows for finer control of the slew values added in the various iterations. This may be particularly useful, for example, where the RMS noise on the input signal is relatively low, e.g. on the order of the least significant bit of the input signal.

It will further be appreciated that many of the specific numerical values used in this example are of no real significance. For example, in the FIGS. 6 and 7 embodiment, the trend counter (slew value index) is a number running from −16 to +16, with thresholds at +/−5, and a base value of 0. In another example, the trend counter may be a number running from 0 to +32, with thresholds at 11 and 21, and a base value of 16 (i.e. the number to which the trend counter is potentially reset in Steps S5a and S5b, and which is used in the comparisons of these steps).

It may be noted that for the specific processing steps of FIG. 6, there is no need for an entry in the look-up table for the base-value of the trend counter because there can never be a call to the table with the trend counter having this value.

Figure 9:
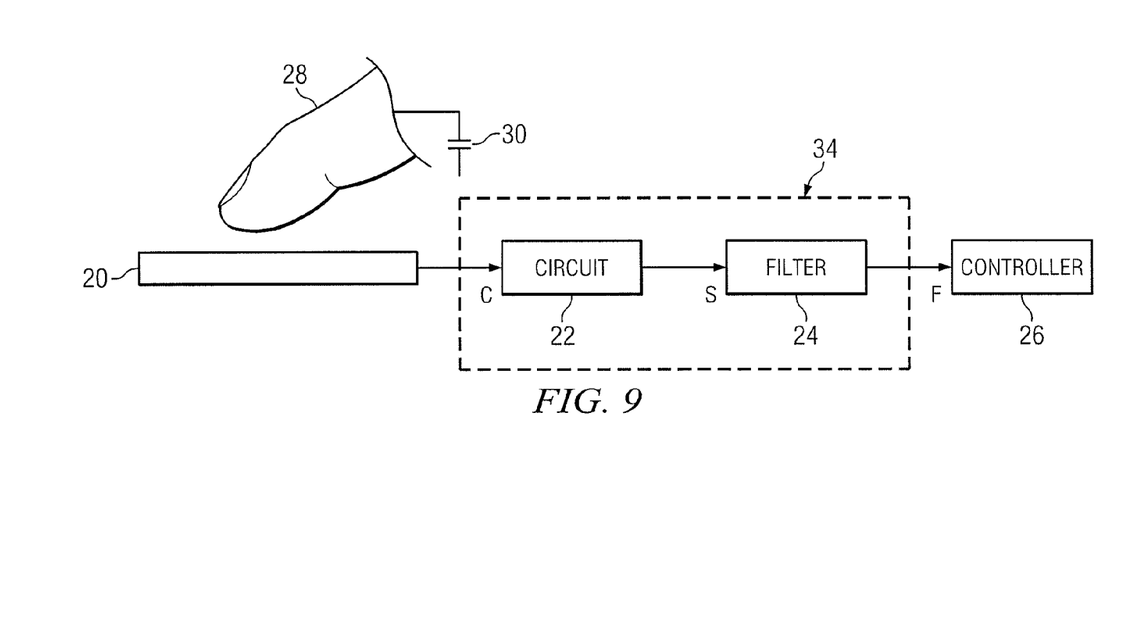
FIG. 9 schematically shows an apparatus according to an embodiment of the invention.

FIG. 9 schematically shows an apparatus according to an embodiment of the invention. The apparatus comprises a sensor electrode 20, a capacitive coupling measurement circuit 22, a filter 24, and a device controller 26. A user's finger 28 (providing a capacitive coupling to ground 30) is shown approaching the sensor electrode 20. The combined functionality of the measurement circuit 22 and the filter 24 is provided by a suitably configured/programmed microcontroller 34. The capacitive coupling measurement circuit 22 is operable to measure a capacitive coupling C of the sensor electrode 20, and to generate a corresponding measurement signal S. For example, in one application the capacitive coupling may have the form schematically shown in FIG. 1 and the corresponding measurement signal S may have the form schematically shown in FIG. 2. The measurement circuit 22 may be of any known type. The filter 24 receives measurement signal S from the measurement circuit 22 and is operable to process the signal in accordance with the flow diagram shown in FIG. 6 so as to generate a filtered output signal F, which may, for example, have the form schematically shown in FIG. 8. The filtered output signal is received by the device controller 26 (i.e. the controller of a device, such as a mobile telephone, in which the sensor electrode 20, measurement circuit 22, and filter 24 are incorporated). The filtered signal F may thus be treated by the device controller 26 in the conventional way as the device controller would otherwise respond to the signal S from the capacitance measurement circuit 22. The incorporation of the filter 24 in accordance with an embodiment of the invention thus filters the signal S from the measurement circuit 22 to provide a filtered signal F for the device controller 26 to respond to, thereby helping to reduce the effects of noise.

Thus there has been described an iterative method for generating a series of output signal values from a series of input signal values and an apparatus incorporating such a method. Iterations of the method comprise the steps of obtaining a current input signal value for the current iteration, comparing the current input signal value with an output signal value determined in a previous iteration, updating a counter value determined in the previous iteration based on the result of the comparison between the current input signal value and the previous output signal value such that the updated counter value replaces the counter value determined in the previous iteration, determining a slew value based on the counter value; and adding the slew value to the previously determined output signal value to generate a new current output signal value. Thus different slew values may be added to the previous output signal to obtain a new output signal. The counter value is updated so that its value reflects recent trends in the input signals. E.g. if the input signal is on an upward trend, the counter value may achieve a relative high value, for example because it is incremented each time an input signal exceeds a previously determined output signal. The magnitude of the slew values may increase as the counter value increases, thereby allowing the output signals to more rapidly track changes in the input signals.

It will be appreciated that although particular embodiments of the invention have been described, many modifications/additions and/or substitutions may be made within the spirit and scope of the present invention. It will further be recognized that the foregoing recital is not intended to list all of the features and advantages that may be associated with embodiments of the invention Those skilled in the art will appreciate that they may readily use both the underlying ideas and the specific embodiments disclosed in this description as a basis for designing other arrangements for carrying out the same purposes of the present invention and that such equivalent constructions are within the spirit and scope of the invention in its broadest form. Moreover, it may be noted that different embodiments of the invention may provide various combinations of the recited features and advantages of the invention, and that less than all of the recited features and advantages may be provided by some embodiments.

It will be further be appreciated that features described above in connection with aspects of the invention will often be equally applicable to, and may be combined with, other aspects of the invention. In particular, features of embodiments of the invention may be combined in any appropriate way and not just in the specific combinations recited in the attached claims.

The invention claimed is:

1. A method comprising:
comparing, using one or more microcontrollers, a current input signal value for a current iteration with a previous output signal value;
updating, using the one or more microcontrollers, a counter value determined in a previous iteration based on a result of the comparing between the current input signal value and the previous output signal value;
determining, using the one or more microcontrollers, a slew value based on the updated counter value; and
adding, using the one or more microcontrollers, the slew value to the previous output signal value to generate a current output signal value.

2. An apparatus comprising:
a storage component; and
a processing component operable to perform operations comprising:
comparing a current input signal value for a current iteration with a previous output signal value;
updating a counter value based on a result of the comparing between the current input signal value and the previous output signal value;
determining a slew value based on the updated counter value; and
adding the slew value to the previous output signal value to generate a current output signal value.

3. The apparatus of claim 2, wherein the determining the slew value is performed based on a size of a difference between the updated counter value and a pre-defined base value.

4. The apparatus of claim 3, wherein the determining the slew value is made such that slew values of greater magnitude are determined if the updated counter value is farther away from the pre-defined base value than if the updated counter value is nearer to the pre-defined base value.

5. The apparatus of claim 2, wherein a relationship between counter values and magnitudes of slew values is a non-linear relationship.

6. The apparatus of claim 2, wherein the slew value is determined from the updated counter value by reference to a pre-defined look-up table.

7. The apparatus of claim 2, wherein the updating the counter value is performed differently depending on whether the counter value is beyond a threshold counter value.

8. The apparatus of claim 2, wherein the updating the counter value comprises:
comparing the updated counter value with a pre-defined threshold counter value, and
incrementing, decrementing, or resetting the counter value to a base value depending on both a result of the comparing the updated counter value with the pre-defined threshold counter value and the result of the comparing the current input signal value with the previous output signal value.

9. The apparatus of claim 2, wherein the operations further comprise setting, if the counter value is beyond a defined threshold value and the updating the counter value brought the updated counter value closer to the defined threshold value, the current output signal value to the previous output signal value.

10. The apparatus of claim 2, wherein the operations further comprise setting, if the current input signal value is within a range bound by the previous output signal value and the current output signal value, the current output signal value to the current input signal value.

11. The apparatus of claim 2, wherein the updated counter value is constrained to values between a predefined maximum counter value and a pre-defined minimum counter value.

12. The apparatus of claim 2, wherein the operations further comprise initializing a counter value and defining a notional previous output signal value for a first iteration.

13. The apparatus of claim 12, wherein the notional previous output signal value for the first iteration is one of the input signal values.

14. The apparatus of claim 2, wherein the slew value is defined to a higher precision than the input signal values.

15. The apparatus of claim 2, wherein the current output signal value is independent of a magnitude of a difference between the current input signal value and the previous output signal value.

16. The apparatus of claim 2, wherein the input signal values represent measurements from a sensing element of a capacitive sensor.

17. The apparatus of claim 2, wherein the operations further comprise providing the output signal value on an output signal line.

18. One or more non-transitory computer-readable storage media that embody logic that is operable, when executed by a processor, to perform operations comprising:
    comparing a current input signal value for a current iteration with a previous output signal value;
    updating a counter value based on a result of the comparing between the current input signal value and the previous output signal value;
    determining a slew value based on the updated counter value; and
    adding the slew value to the previous output signal value to generate a current output signal value.

19. The one or more non-transitory computer-readable storage media of claim 18, wherein the determining the slew value is performed based on a size of a difference between the updated counter value and a pre-defined base value.

20. The one or more non-transitory computer-readable storage media of claim 18, wherein the operations further comprise setting, if the counter value is beyond a defined threshold value and the updating the counter value brought the updated counter value closer to the defined threshold value, the current output signal value to the previous output signal value.

* * * * *